(12) United States Patent
Gao

(10) Patent No.: US 11,477,913 B2
(45) Date of Patent: Oct. 18, 2022

(54) INTEGRATING THERMAL STORAGE SYSTEM IN ELECTRONICS COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 58 days.

(21) Appl. No.: 17/143,997

(22) Filed: Jan. 7, 2021

(65) Prior Publication Data
US 2022/0217867 A1    Jul. 7, 2022

(51) Int. Cl.
H05K 7/20        (2006.01)
(52) U.S. Cl.
CPC ..... *H05K 7/20254* (2013.01); *H05K 7/20163* (2013.01); *H05K 7/20209* (2013.01); *H05K 7/20272* (2013.01); *H05K 7/20281* (2013.01); *H05K 7/20781* (2013.01)

(58) Field of Classification Search
None
See application file for complete search history.

(56) References Cited

U.S. PATENT DOCUMENTS

| | | | |
|---|---|---|---|
| 6,360,559 B1 | 3/2002 | Midorikawa | |
| 8,567,486 B1 * | 10/2013 | Wolf, Sr. ............... | F28D 15/043 165/274 |
| 10,285,310 B2 * | 5/2019 | Bonar ................. | H05K 7/20827 |
| 11,076,505 B2 * | 7/2021 | Gao ..................... | H05K 7/20381 |
| 11,206,745 B2 * | 12/2021 | Gao ..................... | H05K 7/1497 |
| 11,297,741 B2 * | 4/2022 | Gao ..................... | H05K 7/2079 |
| 11,317,543 B1 * | 4/2022 | Gao ..................... | H05K 7/20381 |
| 2008/0013278 A1 | 1/2008 | Landry et al. | |
| 2015/0316334 A1 * | 11/2015 | Chainer ............ | G05D 23/1932 165/287 |
| 2018/0084671 A1 | 3/2018 | Matsumoto et al. | |
| 2020/0288600 A1 | 9/2020 | Gao | |
| 2022/0090868 A1 * | 3/2022 | Donovan .............. | F24F 5/0021 |

* cited by examiner

*Primary Examiner* — Courtney L Smith
(74) *Attorney, Agent, or Firm* — Womble Bond Dickinson (US) LLP

(57) ABSTRACT

A cooling system includes an inlet port and an outlet port to be coupled to one or more electronic devices, a main loop, and a buffer loop. The main loop includes a heat exchanger coupled to the inlet port and the outlet port, and the heat exchanger is to receive fluid from the inlet port, to exchange heat generated by the electronic devices and carried by the fluid, and to return the fluid to the electronic devices via the outlet. A buffer loop is coupled to the inlet port and the main loop. The second loop includes a buffer unit and a first valve to control the fluid to flow into the buffer unit for storage and to discharge the fluid from the buffer unit to follow into the main loop for heat exchange. The buffer unit comprises an air section to store air and a buffer section to store a portion of the fluid. The air section is to adjust an air pressure based on a temperature obtained from a temperature sensor disposed on the heat exchanger and a fluid pressure obtained from a pressure sensor disposed near the inlet port.

20 Claims, 12 Drawing Sheets

INTEGRATING THERMAL STORAGE SYSTEM IN ELECTRONICS COOLING

FIELD OF THE INVENTION

Embodiments of the present invention relate generally to data center cooling. More particularly, embodiments of the invention relate to a buffer unit design for cooling of electronics devices such as data center, IT and server.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
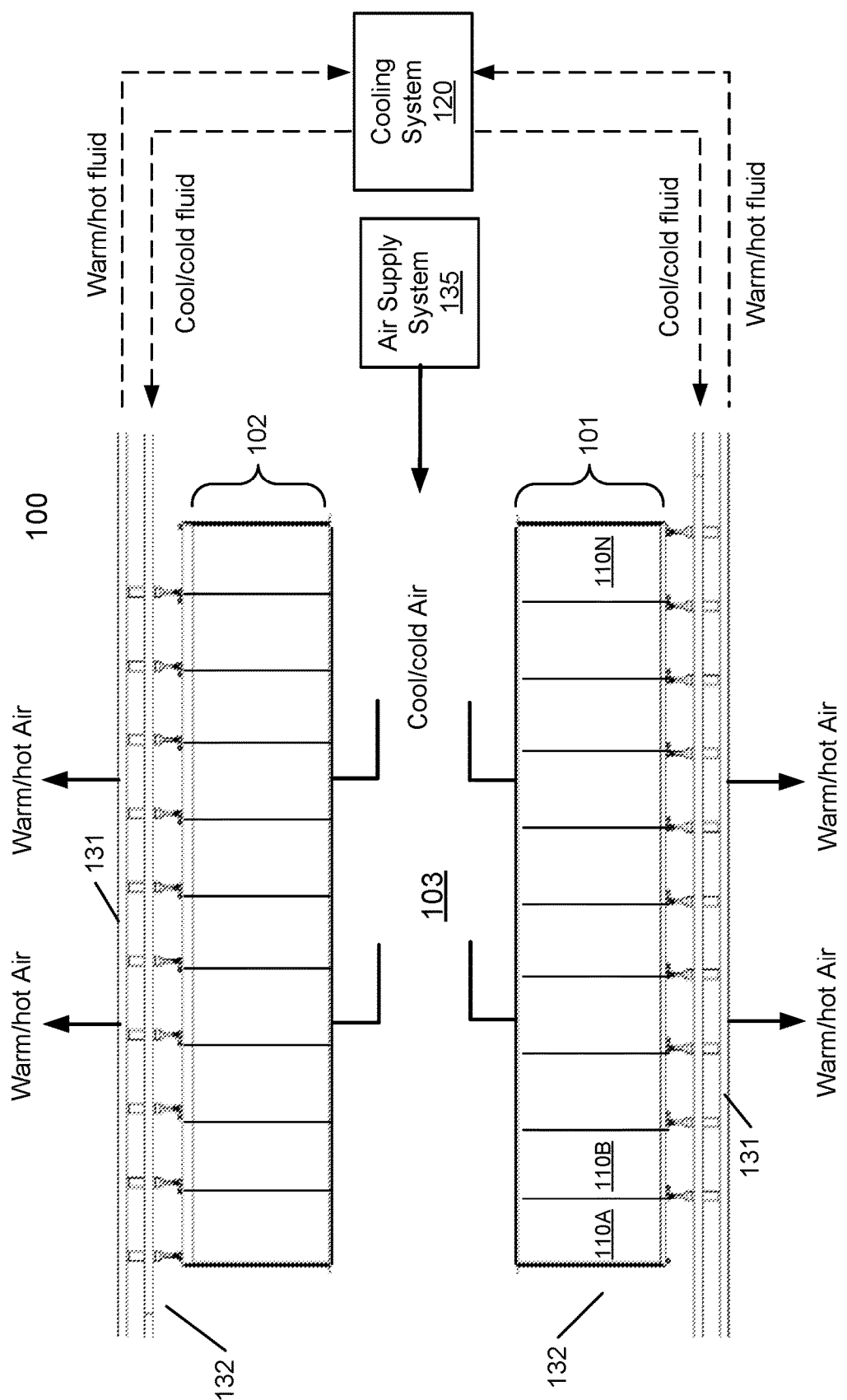
FIG. 1 is a block diagram illustrating an example of a data center facility according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Cooling is critical to IT Hardware industry due to many reasons, besides ensuring normal operation and function. For example, it plays an important role on the business competitiveness, service quality and availability. More importantly, it is a major portion in the infrastructure TCO. It is associated with the profit of an organization. This industry is one of the core competitiveness of the internet giant, cloud computing service providers, as well as high performance computing and AI computing related business service users and providers who design, build and operate compute, storage and other IT hardware platforms and infrastructures. Majority of the hyper-scale owners are customizing the full-stack of these hardware system. For instance, for the rapidly growing cloud computing business, the performance and cost (both capital cost and operation cost) of compute and storage hardware system, cluster and infrastructure requires the service providers to create customized systems which fit their need the best and the most appropriate. These markets require an efficient system design and operation which may benefit the service providers in multiple aspects in a long term. More resilience, efficient and cost effective solutions and architectures are much needed.

The solution proposed in the current disclosure aims to provide an advanced cooling system design and operation method for IT and server cooling. The key problem the design aims to solve is to provide cooling to the server and IT under variations in the heat load and IT, as well as variations in cooling conditions, under different circumstances which may happen during normal or abnormal operating conditions. At the same time, the goal is to improve efficiency and simplify the system control design.

One problem for designing cooling systems is the control strategy for both the internal and external loop. When controlling multiple loops to the operating conditions, the challenges are designing the right control strategy, using the right control signal, and controlling the most appropriate variables. This becomes more challenging when there are multiple heat transfer loops. The current invention aims to design the system as well as the corresponding control to solve this challenge.

As mentioned in the previous paragraph, the power generated by the IT as well as the cooling conditions are significantly differ from day to night. Variances may occur by nature for such system because traffics and computations are significantly impacted by human service and application. Therefore, the heat generated may be much higher during the day than the night. Similarly, cooling conditions are also significantly different during the day and the night. The design aims to solve this challenge by introducing a thermal buffering concept and the corresponding operation. In addition, solving the mismatches of the heat load and nominal cooling improves the reliability and efficiency of the system.

Another focus of the current design is to improve the reliability and stability of a system. This may improve the performance of the cooling system and increase the systems usability in different scenarios.

Historical solutions may need complex control for dealing with the variations in the heat load and cooling capacity. These control solutions may need to be adjusted for different systems and may not be able to have all the possible variations covered in one solution.

The current disclosure introduces the following features: a buffering system which can be used for buffering different types of fluctuations; bi-directional loops and multiple loops design to better integrate the buffer system into a cooling system, either a single phase fluid cooling system or two phase/phase change based cooling system; pressure based system control, including adjustable control set-point for the valve; customized buffer design and corresponding loops for different scenarios; pressure adjusting within the buffering system; parallel system design; innovative buffering loop design, etc.

Embodiments of the application focus on a thermal buffer unit integrated to the cooling system for electronics cooling. In an embodiment, the buffer unit has multiple sections includes an air section and the buffer section to store a portion of the fluid. For example, the air section is used to adjust an air pressure when fluid entering into the system. In an embodiment, during the buffering period, the air section is set under the low pressure condition. During the discharging period, in an embodiment, the volume of the air section is changed to smaller so the pressure within the air section increases, and then the increased pressure of the air section drives the buffered fluid out of the buffer section. Embodiments of the application include different system designs proposed for integrating the buffer unit into the cooling system, for single phase fluid, phase change fluid as well as mixing-phase fluids. The pressure measured in the system are used to control the valves on the loops to adjust the open set-point of them, and to enable different types of operations and corresponding fluid control in these operations.

In an embodiment, a cooling system includes an inlet port and an outlet port to be coupled to one or more electronic devices, a main loop having a heat exchanger coupled to the inlet port and the outlet port, and a buffer loop coupled to the inlet port and the main loop. For example, the main loop having a heat exchanger to receive fluid from the inlet port, to exchange heat generated by the electronic devices and carried by the fluid, and to return the fluid to the electronic devices via the outlet.

In an embodiment, a cooling system includes a buffer loop with a buffer unit and a first valve to control the fluid to flow into the buffer unit for storage and to discharge the fluid from the buffer unit to follow into the main loop for heat exchange.

In an embodiment, a cooling system includes a buffer loop with the buffer unit which comprises an air section to store air and a buffer section to store a portion of the fluid, where the air section is to adjust an air pressure based on a temperature obtained from a temperature sensor disposed on the heat exchanger, and a fluid pressure obtained from a pressure sensor disposed near the inlet port. In one embodiment, the temperature measurement is selected and set at the location that presents the variations in cooling capacity on the primary cooling side.

In an embodiment, a cooling system includes a buffer loop with the first valve to allow the fluid to be stored in the buffer unit in response to determining that the temperature is above a predetermined temperature and the fluid pressure is above a predetermined pressure. In an embodiment, the stored fluid is discharged from the buffer unit to the heat exchanger for heat exchange, in response to determining that the temperature is below the predetermined temperature or an air pressure of the air section of the buffer unit is above a predetermined air pressure. In an embodiment, the stored fluid is discharged from the buffer unit to the heat exchanger for heat exchange, in response to determining an air pressure of the air section of the buffer unit is above a predetermined air pressure. In an embodiment, even the air pressure of the buffer unit's air section is above a predetermined air pressure, the cooling system will not switch to buffering mode or discharging mode. In an embodiment, the buffer unit further comprises a pressure adjusting valve to pump air into the air section to provide pressure to force and assist the fluid out of the buffer unit during discharge.

In an embodiment, a cooling system includes a buffer loop further comprising a second valve to connect the buffer unit to the outlet port, and the second valve is to allow the fluid from the fluid section of the buffer unit to the outlet port, bypassing the heat exchanger. For example, the second valve is a pressure controllable valve to control a flowrate from the buffer unit to the outlet port based on an air pressure within the air section of the buffer unit. In an embodiment, the fluid from the outlet port may merge into the fluid leaving the heat exchanger. In an embodiment, the fluid from the outlet port and the fluid leaving the heat exchanger may have different temperatures, but in the same liquid phase.

In an embodiment, a cooling system includes a buffer loop further comprising a third valve coupled between the inlet port and the heat exchanger, wherein the third valve is to control a flowrate into the heat exchanger.

In an embodiment, the fluid is a two-phase fluid, wherein the fluid transitions into a vapor during the phase change process.

In an embodiment, the buffer loop further comprises a supply line and a return line. For example, the supply line is coupled between the inlet port and the buffer unit to receive the fluid from the inlet port to be stored in the buffer unit. In an embodiment, the return line coupled between the buffer unit to an inlet of the heat exchanger to return the stored fluid to the heat exchanger.

In an embodiment, a cooling system further includes a third loop having a third valve coupled between the inlet port and the outlet port. For example, the third loop operates as a bypass loop to directly pass at least a portion of the fluid from the inlet port to the outlet port, bypassing the heat exchanger and the buffer unit.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
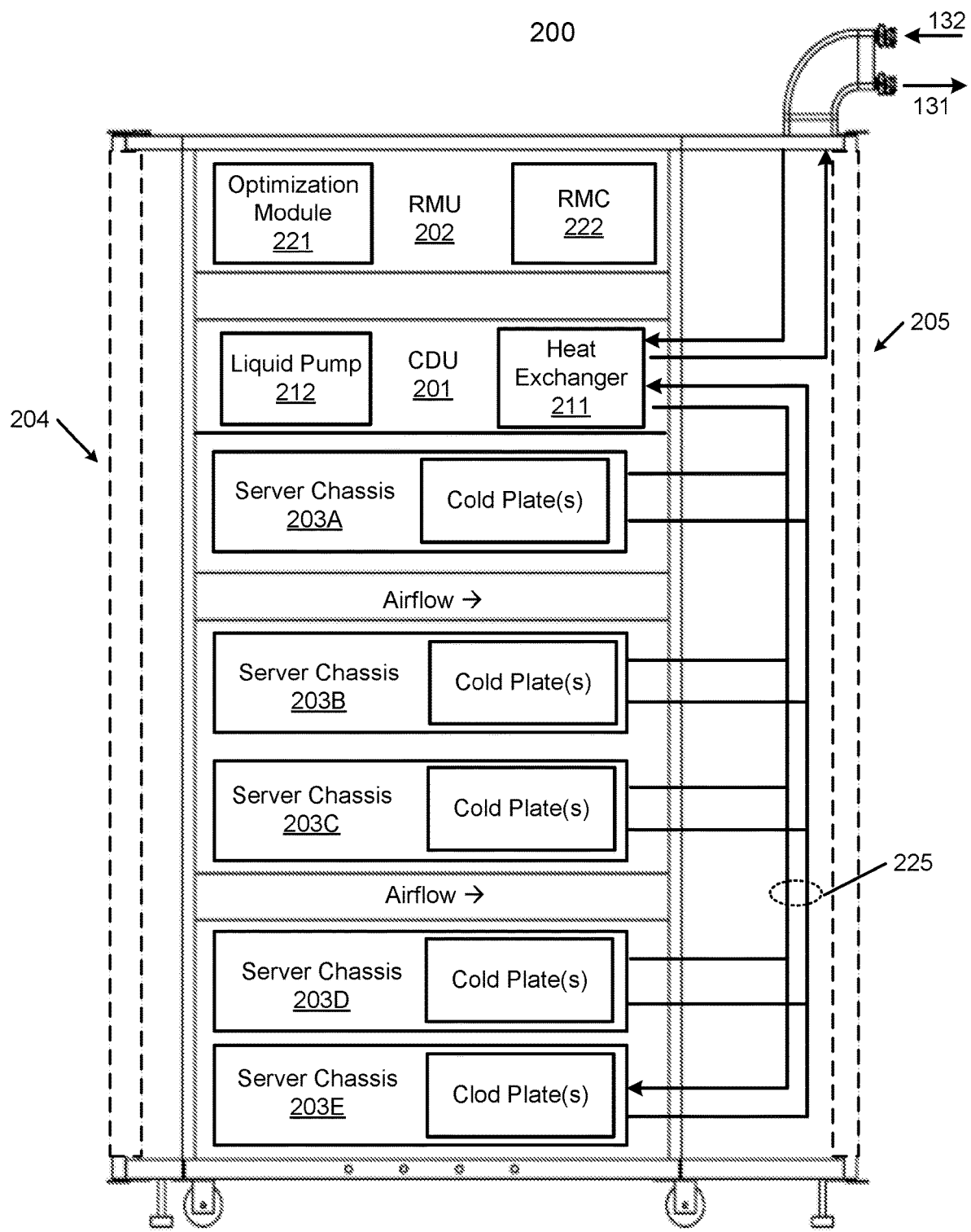
FIG. 2 is a block diagram illustrating an example of an electronic rack according to an embodiment of the application.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules 231 and an optimal pump speed for liquid pump 212, such that the total power consumption of liquid pump 212 and fan modules 231 reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules 231, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
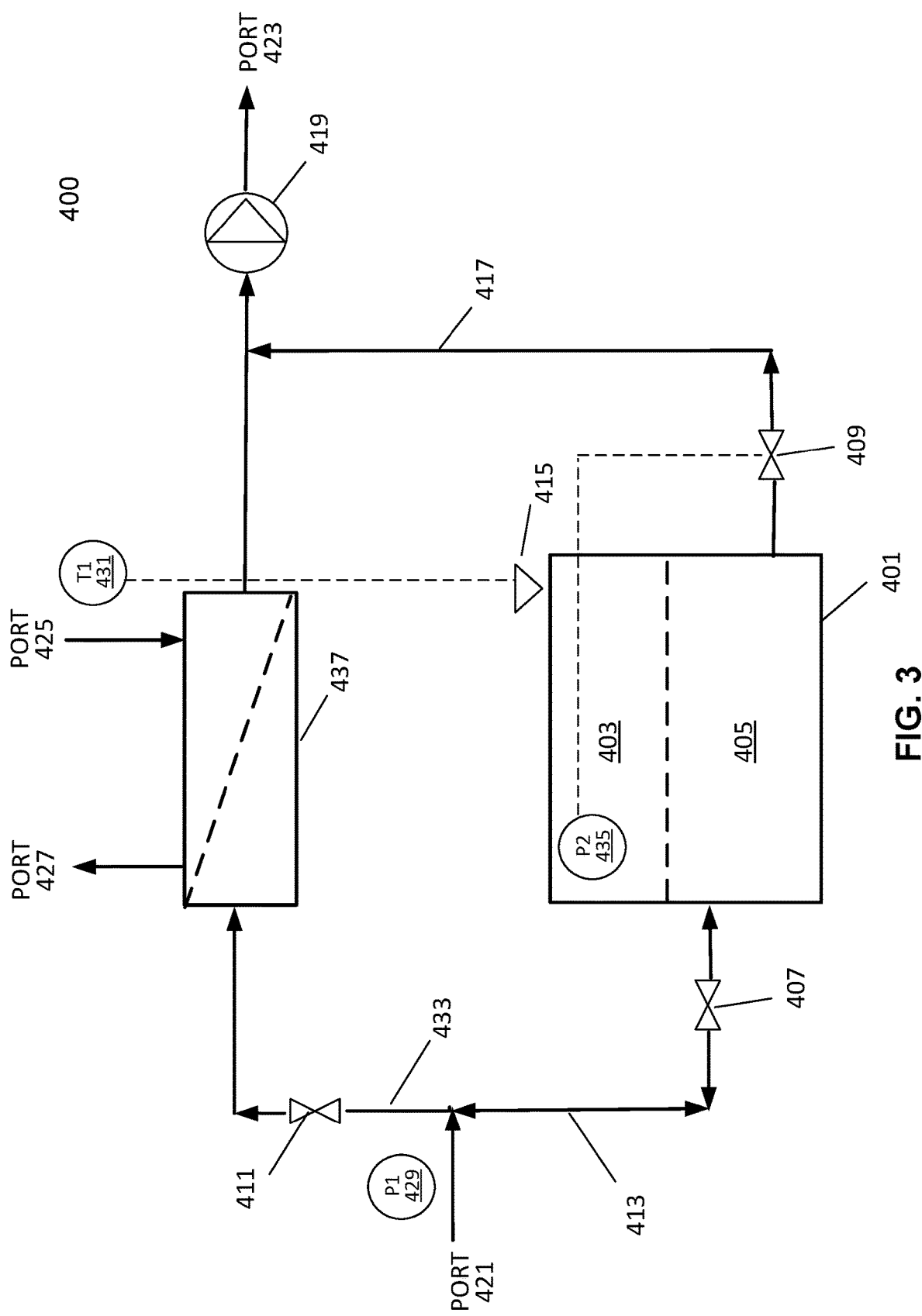
FIG. 3 shows an example cooling system according to an embodiment of the application.

FIG. 3 shows an example cooling system 400 according to an embodiment of the application. For example, FIG. 3 shows a schematic representation of the cooling system design to provide liquid cooling to electronic devices. The cooling system may be utilized as a part of cooling system 120 of data center 100 as shown in FIG. 1 or as part of CDU 201 of electronic rack 200 as shown in FIG. 2. In an embodiment, the buffer unit 401 is integrated into the cooling loop 433 consisted of a heat exchanger 437, the pump 419, the valve 411 and so on. The buffer unit 401 is in parallel with the main cooling loop 433. On the buffer loop 413, the main parts are the buffer unit 401 as well as the corresponding loops 413 for integrating the buffer unit 401 into the system 400.

In an embodiment, the buffer unit 401 includes an air section 403 and a main buffer section 405. For example, a pressure sensor 435 is used in the air section to sense or measure the air pressure therein, and an adjusting/charging valve 415 is used to inject or release air into or from the air section side. Valve 415 is configured to inject or release air based on the temperature of external fluid of heat exchanger 437, which may be sensed or measured by temperature sensor 431. For example, when the temperature of the fluid drops below a predetermined threshold, which indicates that heat exchanger 437 has cooling capacity. In response, valve 407 is opened and additional air is injected via valve 415 into the air section of buffer unit 401. The fluid stored in the buffer unit 401 may be discharged via paths 413 and 433 to heat exchanger 437 to cool the fluid. Alternatively, when the air pressure of the air section of buffer unit 401 is higher than a predetermined threshold, which may be sensed by pressure sensor 435, valve 409 is opened to discharge the fluid via path 417 to outlet port 423.

In an embodiment, the buffer loop 413 is designed as the bidirectional loop which means the fluid can go either direction. For example, the fluid can flow from inlet port 421 to buffer unit 401 or from buffer unit 401 to heat exchanger 437. In an embodiment, valve 407 is a pressure controlled bidirectional valve to accommodate the operation of the bidirectional loop 413. For example, the bidirectional loop 413 allows the fluid to flow either direction based on the fluid pressure sensed by pressure sensor 421 and/or air pressure sensed by pressure sensor 435. The fluid may be a single-phase fluid or a multi-phase fluid (also referred to as two-phase fluid). The multi-phase fluid may transition between a liquid form and a vapor form dependent upon the temperature of the fluid. When the temperature of the fluid in the liquid form arises above a predetermined threshold, the fluid evaporates into vapor, and the temperature drops below a predetermined threshold, the vapor transforms back to the liquid form.

One of the purposes of buffer unit 401 is to temporarily divert and store a portion of the fluid received from inlet port 421, which may be controlled by valve 407 based on pressure data provided by pressure sensor 429 and/or pressure sensor 435. As a result, the fluid pressure flowing into heat exchanger 437 can be reduced. Such an operation is referred to as a buffering mode.

In an embodiment, the direct return loop 417 is connecting the outlet of the buffer unit 401 and the outlet of the heat exchanger side 437. The fluid buffered in buffer unit 401 can be discharged to outlet port 423 via path 417. It needs to be mentioned that there are different types of loop designs that can be used for integrating the buffer to the cooling system. For example, the design shown in FIG. 3 is mainly for a single phase liquid operation. In an embodiment, pressure sensor P1 429 measures the system inlet pressure, and pressure sensor P2 435 measures the air section pressure.

Figure 4:
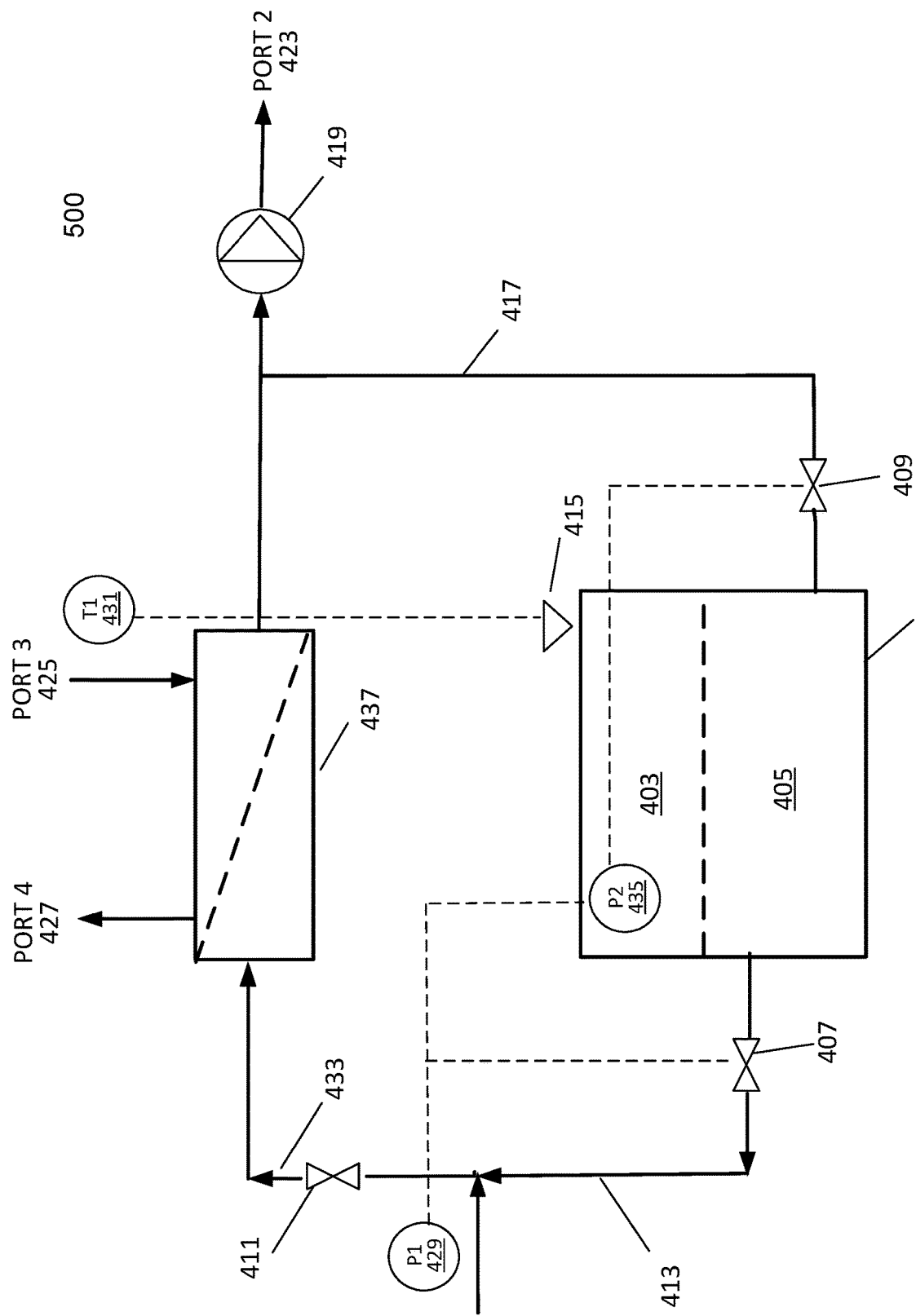
FIG. 4 shows another example cooling system according to an embodiment of the application.

FIG. 4 shows another example cooling system 500 according to an embodiment of the application. For example, FIG. 4 shows the cooling system 500 under a discharging mode. In an embodiment, the loop 413 shows that during the discharging mode, the fluid within the buffer section 405 is being released back to the cooling system through the bidirectional loop 413 as well as the valve 407 from the buffer unit 401 to port 429. In an embodiment, as shown in FIG. 4, the valve 409 is close.

Figure 5:
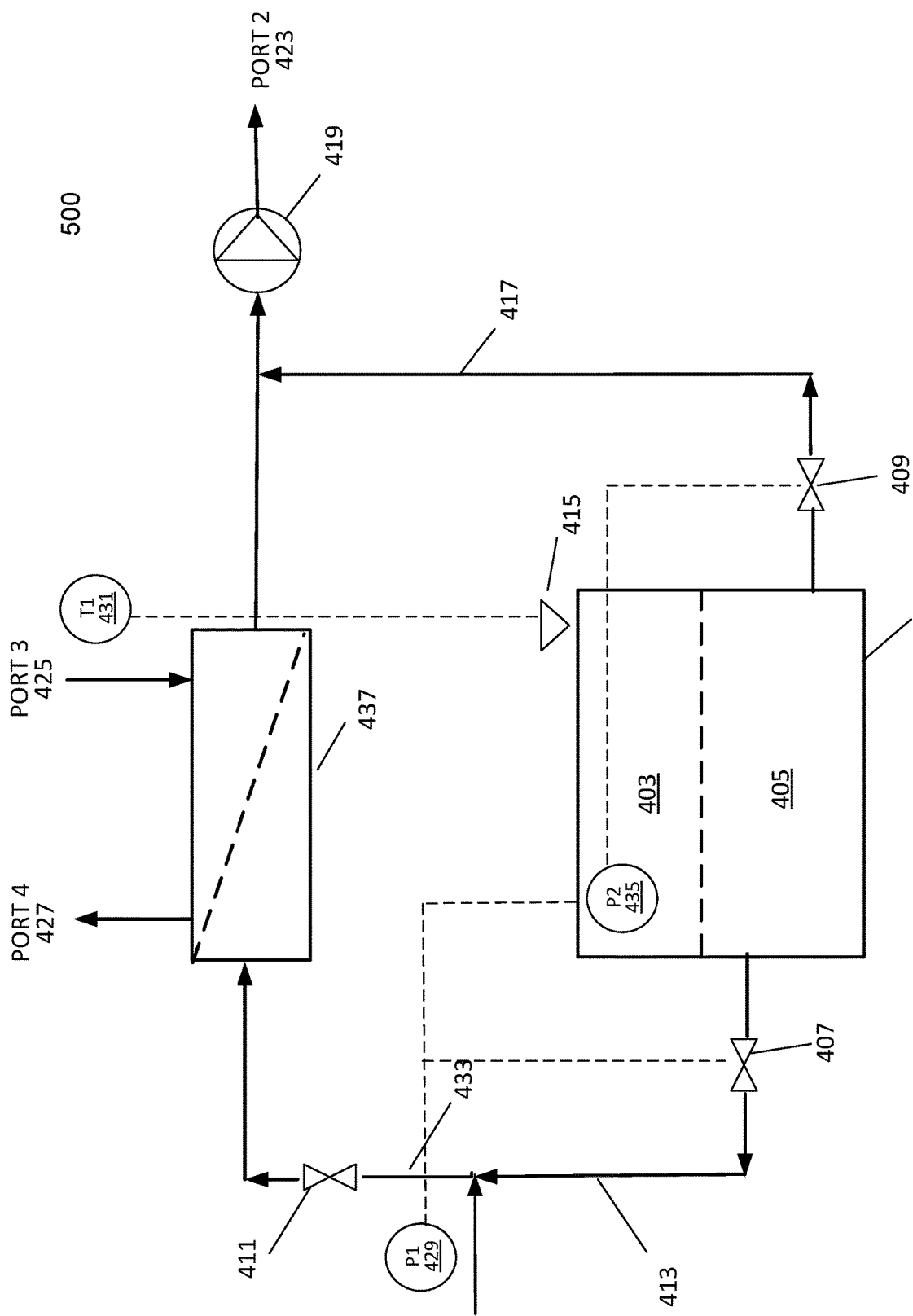
FIG. 5 shows another example cooling system according to an embodiment of the application.

FIG. 5 shows another example cooling system 500 according to an embodiment of the application. For example, FIG. 5 shows the cooling system 500 under the discharging mode using multiple loops (e.g., 413 and 417) according to an embodiment. In an embodiment, both the bidirectional loop 413 as well as the direct return loop 409 are used for releasing the fluid stored in the buffer section 405. In this process, for example, the adjusting valve 415 is used to pump more air into the air section 403 to increase the pressure P2 435 to drive the fluid together with the pump 419. The reason for releasing the fluid in two loops (i.e., 413 and 415) is for the better cooling system outlet fluid temperature control. In an embodiment, the fluid exits the bidirectional pass 413 through the heat exchanger 437 while the fluid exits the direct return loop 417 does not. Therefore, such design may enable flexible system control based on the design conditions according to an embodiment. In an embodiment, the fluid from the direct return loop 417 may have a higher temperature than the fluid leaving the heat exchanger 437.

Figure 6A:
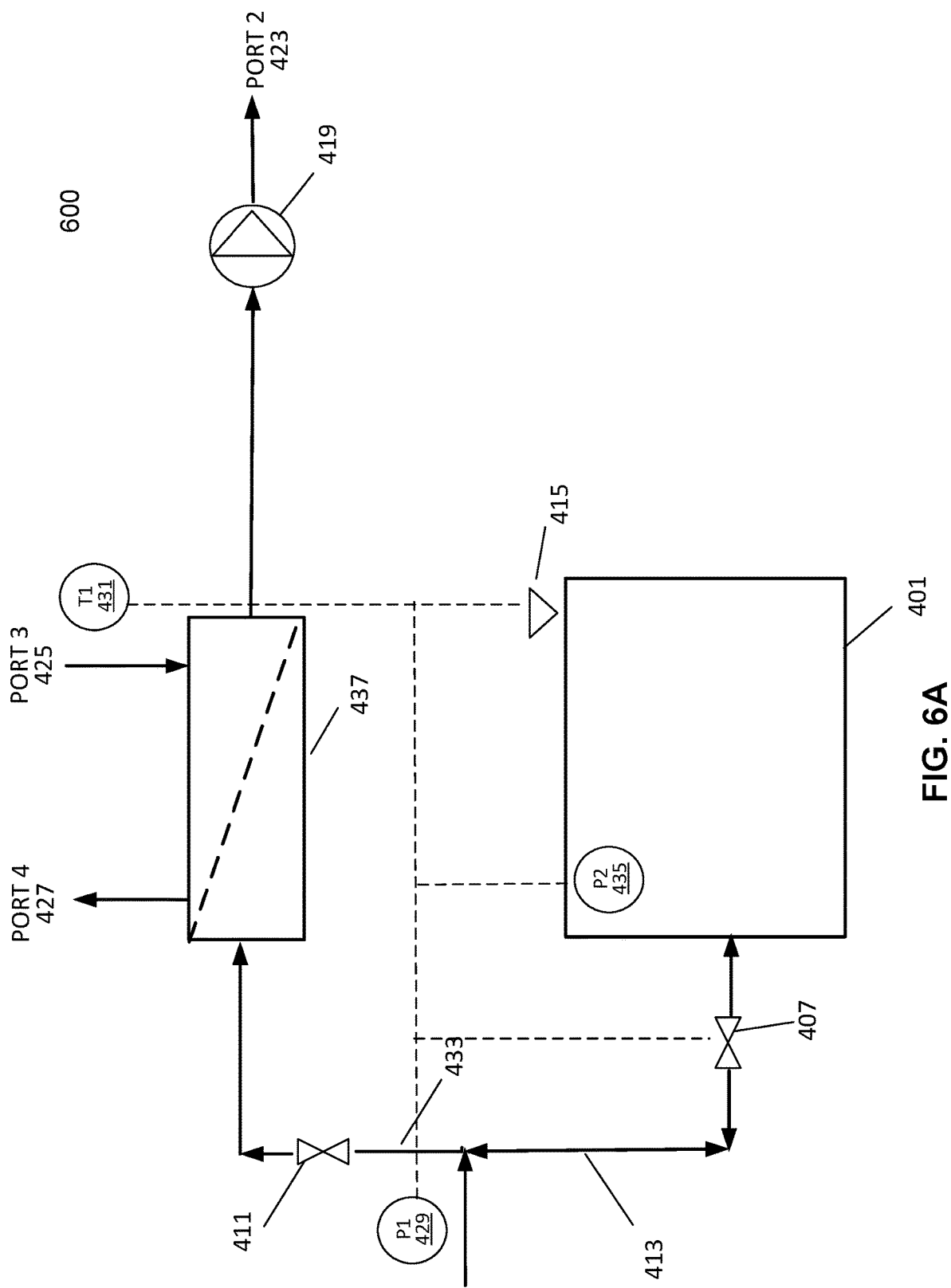
FIG. 6A shows another example cooling system according to an embodiment of the application.

FIG. 6A shows another example cooling system 600 according to an embodiment of the application. For example, FIG. 6A shows another cooling system design for integrating the buffer unit 401 into the cooling system 600 according to an embodiment. It can be seen that the buffer unit 401 is different from previous figures. It needs to be mentioned that the buffer unit 401 can be used the same design as before, however, there might be different customization needed especially for operating a buffer section used for storing vapor or mix fluid and vapor. FIG. 6A shows a vapor based system design. Only one bidirectional loop 413 is used for both in-taking and releasing the vapor. It needs to be mentioned that the detailed internal design of the buffer unit is not shown in the figure. In FIG. 6A, by adjusting the open pressure of valve 407, the valve can open in either direction. For example, when pressure P1 is greater than pressure P2, the system may start charging the buffer unit. In the discharging mode, value 407 is triggered to open from the other direction. For example, P1 and P2 may be of similar value during discharging.

Figure 6B:
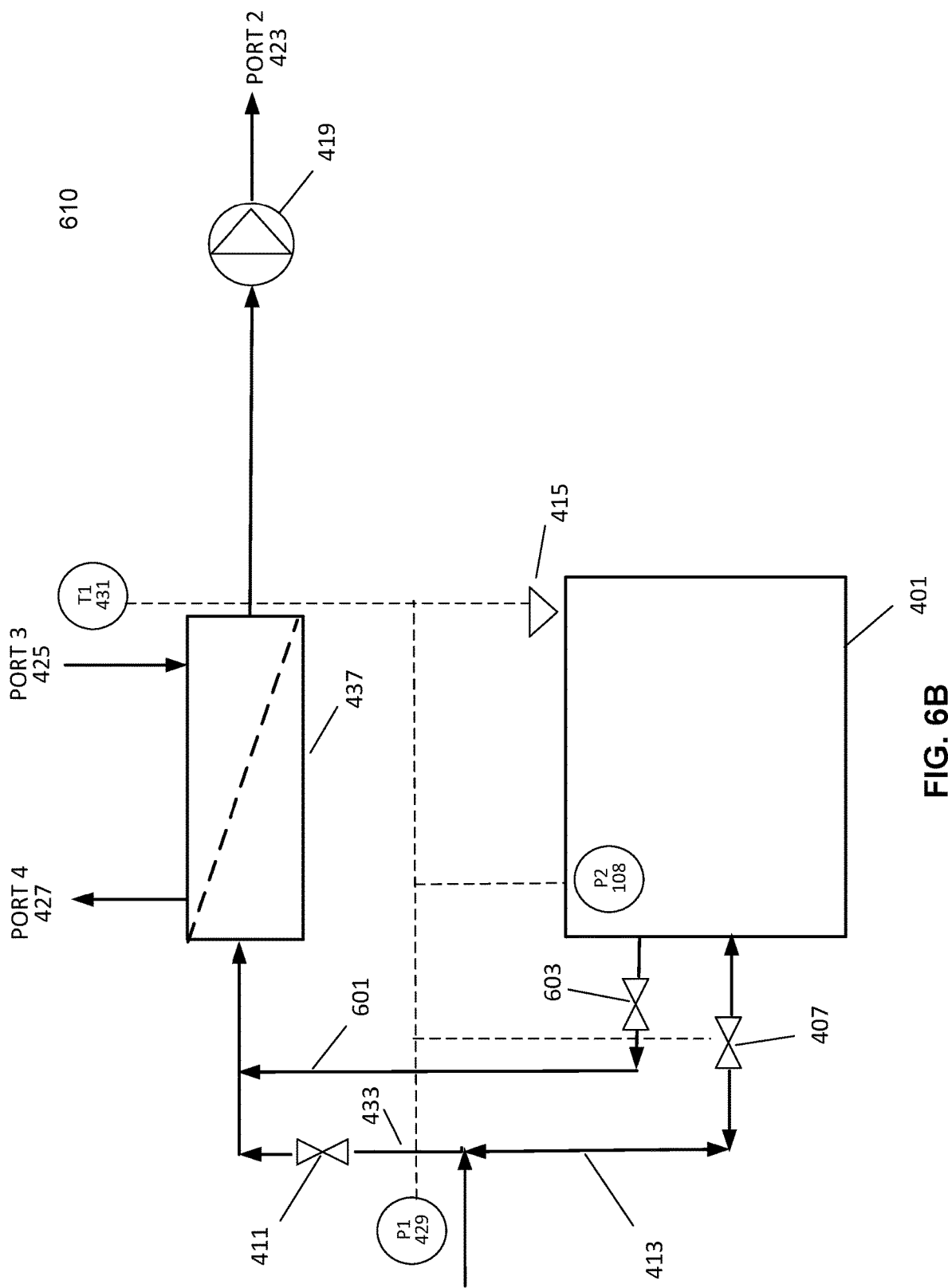
FIG. 6B shows another example cooling system according to an embodiment of the application.

FIG. 6B shows another example cooling system 610 according to an embodiment of the application. For example, FIG. 6B shows another cooling system design for integrating the buffer unit 401 into the cooling system 610 according to an embodiment. In an embodiment, there is a separate return loop 601 with a two-way valve 603 connecting the buffer unit 401 to the inlet of the heat exchanger 437. For example, as mentioned, since vapor is supposed to be cooled before it passing the pump 419, therefore, the design shown in FIG. 6B is different from the design shown in FIG. 5. It needs to be mentioned that a separate return loop 601 is used in the cooling system 610, and the bidirectional loop 413 can still be as a bidirectional loop as shown in FIG. 6B.

Figure 6C:
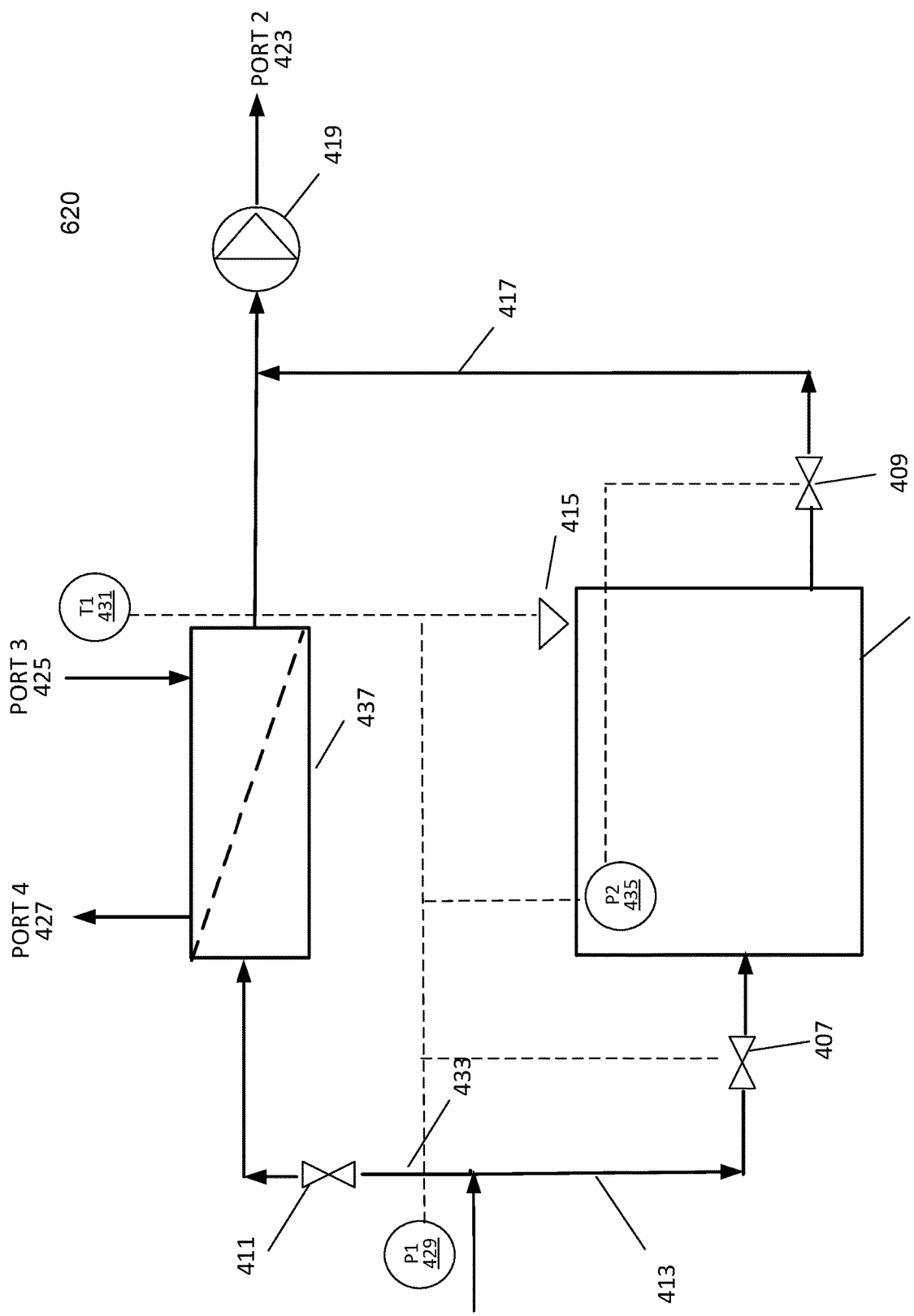
FIG. 6C shows another example cooling system according to an embodiment of the application.

FIG. 6C shows another example according to an embodiment of the application. For example, FIG. 6C shows another system design which is used to handle the complicated case. In an embodiment, the bidirectional loop 413 is used for in-taking both liquid and vapor during buffering period. For example, since both liquid and vapor are stored in the buffer unit 401, during the discharging period, bidirectional loop 413 is used for releasing the vapor, and liquid loop 417 is used for releasing the liquid. In an embodiment, during the discharging period, the buffer section pressure P2 435 maybe controlled slightly higher than P1 429, while the valve 411 maybe controlled to the maximum open ratio position. In an embodiment, the cooling system 620 is designed to buffer mix phased fluid and discharging separately since vapor must be reverted to liquid by removing latent heat.

Figure 7:
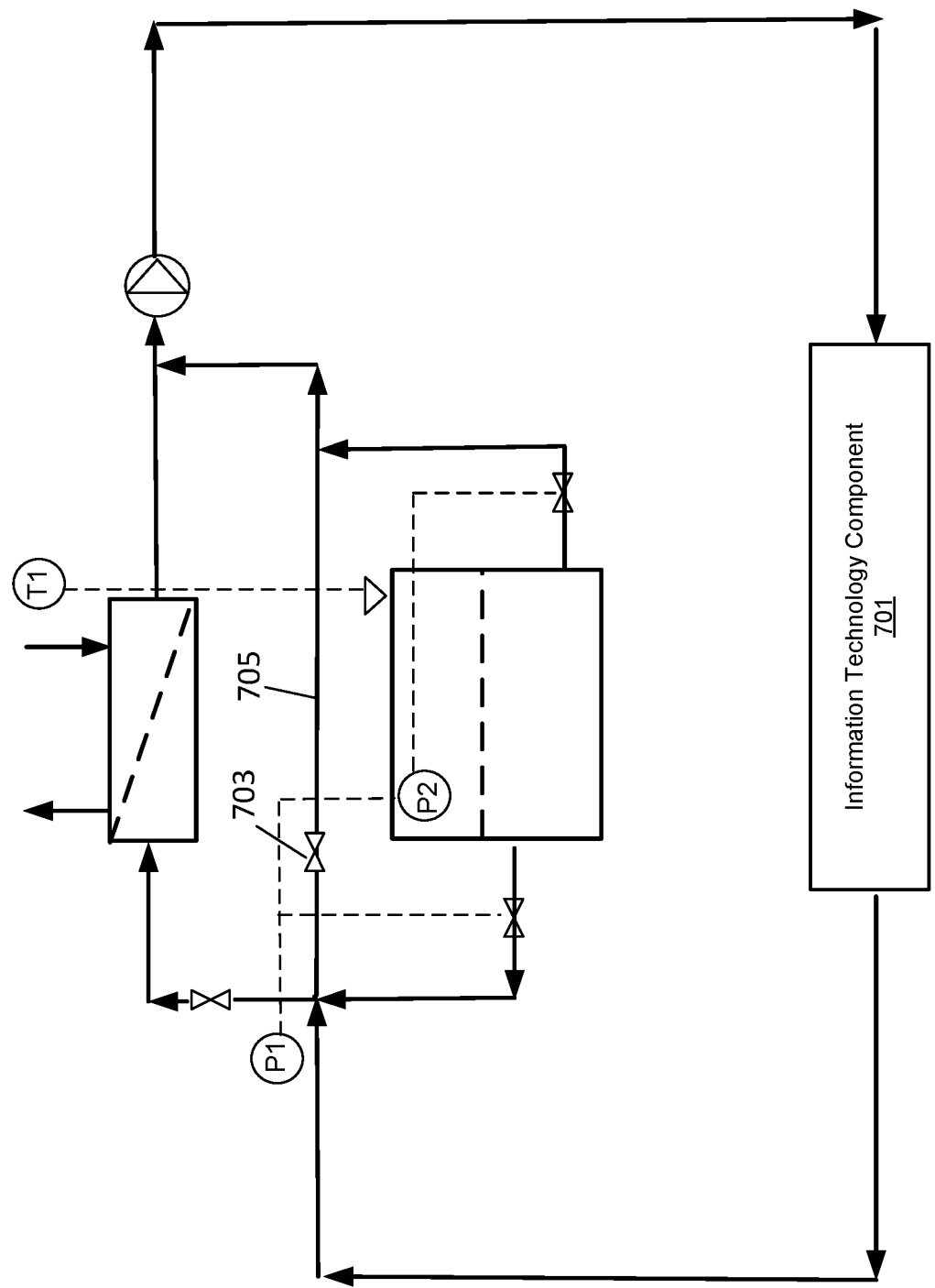
FIG. 7 shows a buffering system integrated into a cooling system connected with an IT example according to an embodiment of the application.

FIG. 7 shows a buffering system integrated into a cooling system connected with an IT 701 example according to an embodiment of the application. For example, in FIG. 7, the cooling system includes a bypass loop 705 with a valve 703 to allow the fluid to flow through the bypass loop 705. In some embodiment, when the main loop with heat exchanger and/or the buffer loop fails or need to do the maintenance, the fluid can still flow through it with minimum or no interference for other IT components 701.

Figure 8:
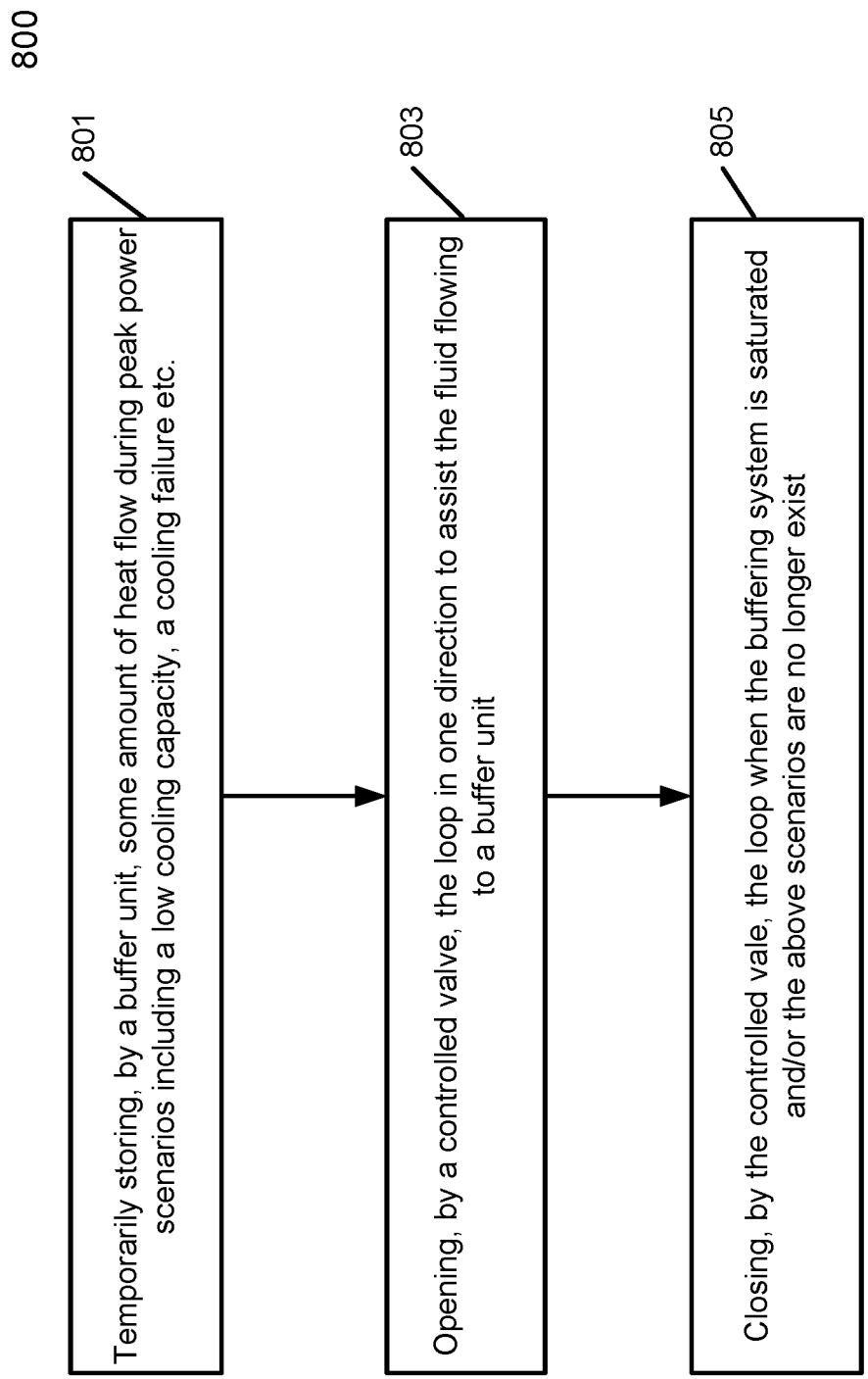
FIG. 8 is a flow diagram of an example process for a cooling system according to an embodiment of the application.

FIG. 8 is a flow diagram of an example process 800 during the buffering period for a cooling system according to an embodiment of the application. For example, FIG. 8 shows the detailed operation design and control method for buffering the heat by storing the fluid in the buffer section.

At operation 801, the buffer unit 401 can temporarily store some amount of heat flow during peak power scenarios including a low cooling capacity, a cooling failure, etc. At operation 803, the controlled valve 407 can open the loop 413 in one direction to assist the fluid flowing to a buffer unit 401. At operation 805, the controlled valve 407 can close the loop 413 when the buffering system is saturated, and/or the above scenarios are no longer exist.

Figure 9:
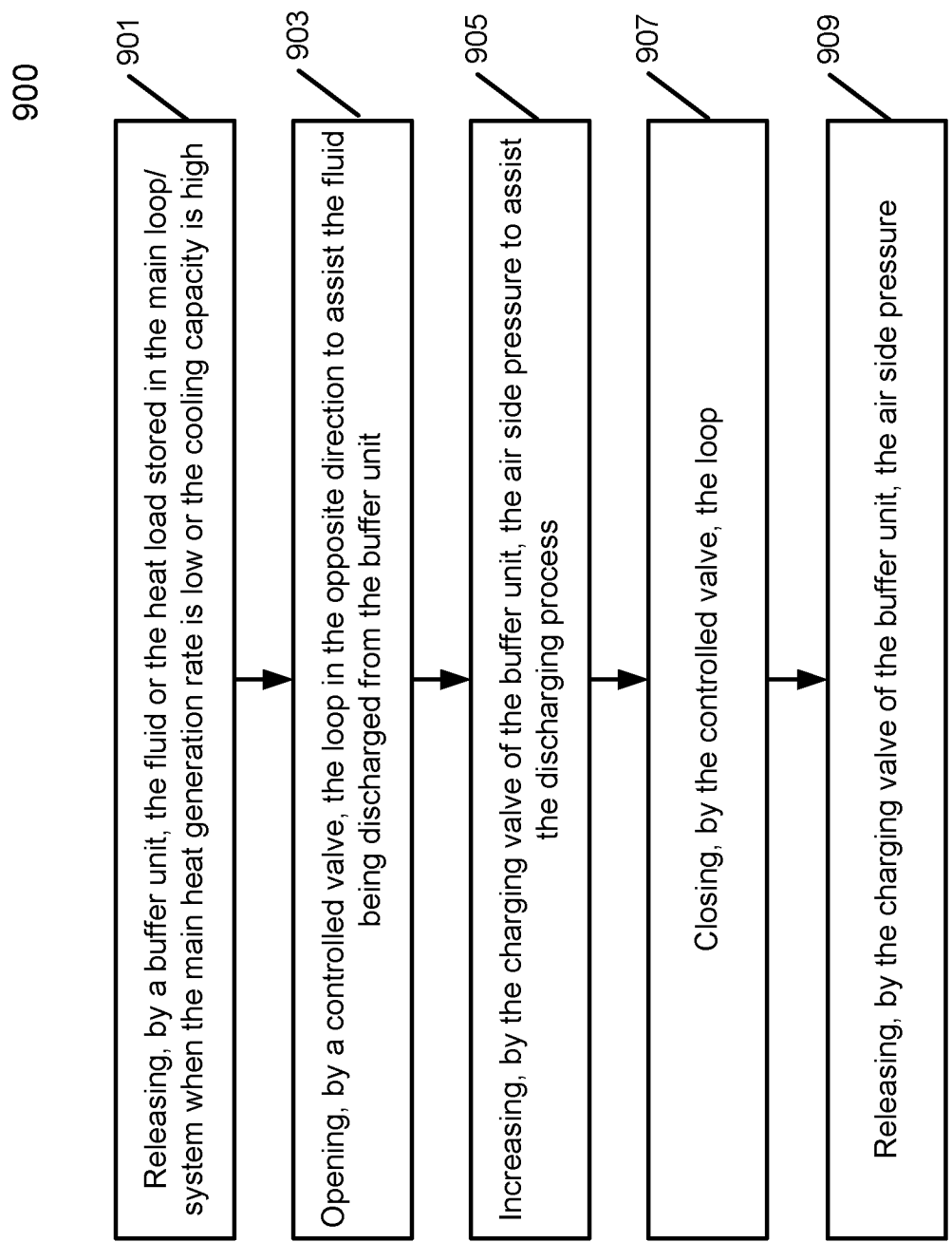
FIG. 9 is another flow diagram of an example process for a cooling system according to an embodiment of the application.

FIG. 9 is a flow diagram of an example process 900 during the discharging period for a cooling system according to an embodiment of the application. For example, FIG. 9 shows the detailed operation design and control method for discharging the fluid stored in the buffer section.

At operation 901, a buffer unit 401 can release the fluid or the heat load stored in the main loop when the main heat generation rate is low or the cooling capacity is high. At operation 903, a controlled valve 407 can open the loop in the opposite direction to assist the fluid being discharged from the buffer unit 401. At operation 905, the charging valve 415 of the buffer unit 401 can increase the air pressure to assist the discharging process 900. At operation 907, the controlled valve 407 can close the loop. At operation 909, the charging valve 415 of the buffer unit 401 can release the air side pressure P2 435.

Figure 10:
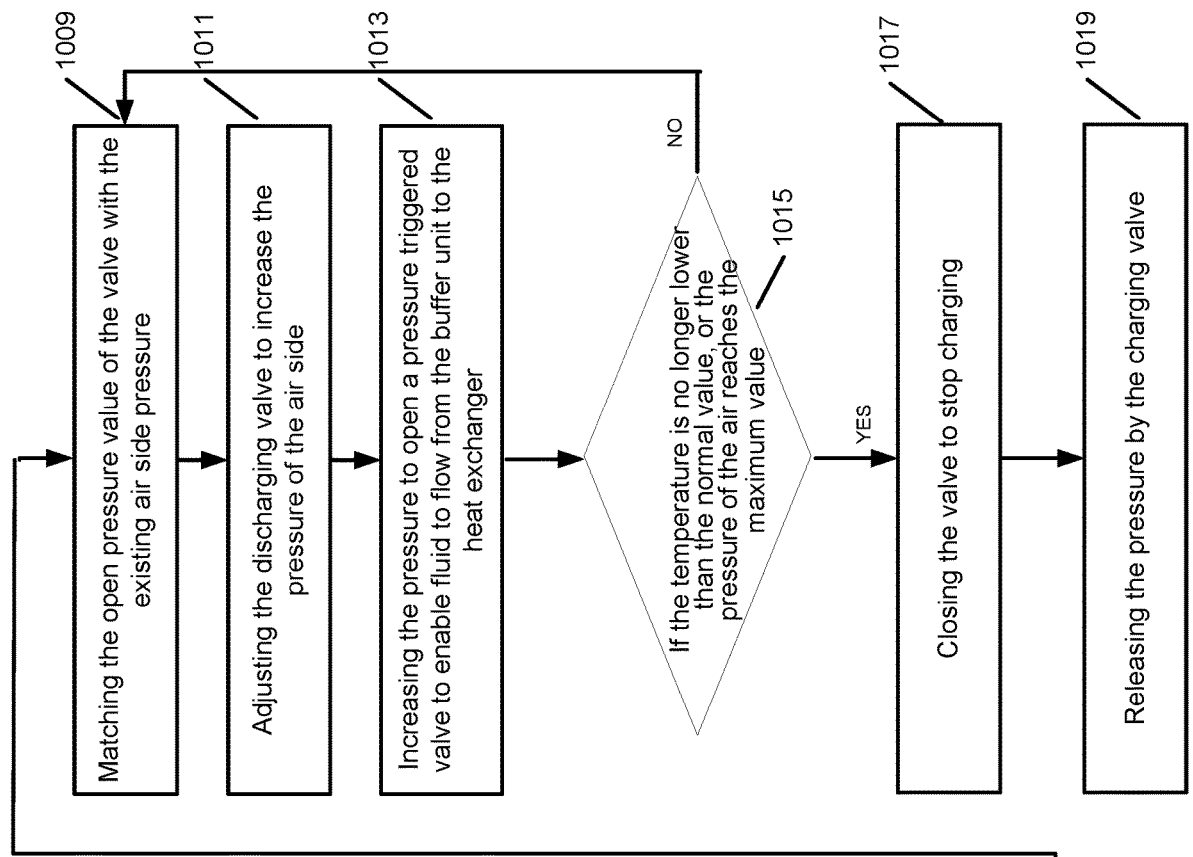
FIG. 10 is another flow diagram of an example process for a cooling system according to an embodiment of the application.
Figure 10:
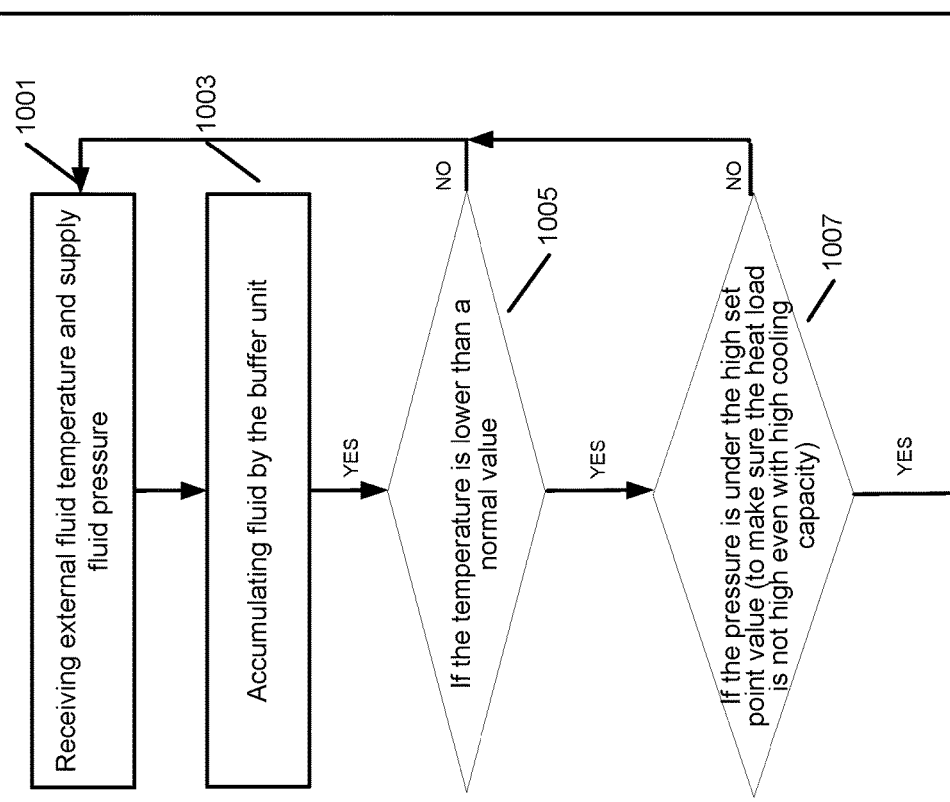

FIG. 10 shows a flow diagram of an example process 1000 for a cooling system according to an embodiment of the application. At operation 1001, the cooling system can receive the temperature of the external fluid and the fluid pressure by one or more sensors. At operation 1003, the buffer unit 401 can accumulate fluid. At operation 1005, if the temperature of the external fluid is not lower than the normal value, then goes back to the operation 1001; if the temperature of the external fluid is lower than the normal value, then moves to the operation 1007.

At operation 1007, if the pressure is not under the high set-point value, then goes back to operation 1001; if the pressure is under the high set-point value (i.e., to make sure the heat load is not high even with the high cooling capacity), then moves to 1009. At operation 1009, the cooling system matches the open pressure value of the valve with the existing air side pressure. At operation 1011, the discharging valve can be adjusted by increasing the air side pressure. At operation 1013, the pressure triggered valve increases pressure to enable fluid to flow from the buffer unit 401 to the heat exchanger 437.

At operation 1015, if the temperature of the external fluid is lower than the normal value, or the pressure of the air does not reach the maximum value, then goes back to operation 1009; if the temperature of the external fluid is no longer lower than the normal value, or the pressure of the air reach the maximum value, then moves to operation 1017. At operation 1017, the cooling system stops charging, and the valve closes. At operation 1019, the charging valve starts to release the pressure.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling system, comprising:
   an inlet port and an outlet port to be coupled to one or more electronic devices;
   a first loop having a heat exchanger coupled to the inlet port and the outlet port, wherein the heat exchanger is to receive fluid from the inlet port, to exchange heat generated by the electronic devices and carried by the fluid, and to return the fluid to the electronic devices via the outlet port; and
   a second loop coupled to the inlet port and the first loop, the second loop having a buffer unit and a first valve to control the fluid to flow into the buffer unit for storage and to discharge the fluid from the buffer unit to follow into the first loop for heat exchange, wherein the second loop is bidirectional,
   wherein the buffer unit comprises an air section to store air and a buffer section to store a portion of the fluid, and wherein the air section is to adjust an air pressure based on a temperature obtained from a temperature sensor disposed on the heat exchanger and a fluid pressure obtained from a pressure sensor disposed near the inlet port.

2. The cooling system of claim 1, wherein the first valve is to allow the fluid to be stored in the buffer unit in response to determining that the temperature is above a predetermined temperature and the fluid pressure is above a predetermined pressure.

3. The cooling system of claim 2, wherein the stored fluid is discharged from the buffer unit to the heat exchanger for heat exchange, in response to determining that the temperature is below the predetermined temperature or an air pressure of the air section of the buffer unit is above a predetermined air pressure.

4. The cooling system of claim 3, wherein the buffer unit further comprises a pressure adjusting valve to pump air into the air section to provide pressure to force the fluid out of the buffer unit during discharge.

5. The cooling system of claim 1, wherein the second loop further comprises a second valve to connect the buffer unit to the outlet port, and wherein the second valve is to allow the fluid from the buffer section of the buffer unit to the outlet port, bypassing the heat exchanger.

6. The cooling system of claim 5, wherein the second valve is a pressure controllable valve to control a flowrate from the buffer unit to the outlet port based on an air pressure within the air section of the buffer unit.

7. The cooling system of claim 5, further comprising a third valve coupled between the inlet port and the heat exchanger, wherein the third valve is to control a flowrate into the heat exchanger.

8. The cooling system of claim 1, wherein the fluid flowing into the second loop is a two-phase fluid including both liquid and vapor.

9. The cooling system of claim 8, wherein the two-phase fluid is stored in the buffer unit, wherein the second loop, during a buffering period, is used to receive the liquid and the vapor, wherein the second loop, during a discharging period, is used for releasing the vapor, and wherein a liquid loop, connected between the buffer unit and the outlet port, is used for releasing the liquid during the discharging period.

10. The cooling system of claim 1, further comprising a third loop having a third valve coupled between the inlet port and the outlet port, wherein the third loop operates as a bypass loop to directly pass at least a portion of the fluid from the inlet port to the outlet port, bypassing the heat exchanger and the buffer unit.

11. An electronic rack of a data center, comprising:
   one or more electronic devices operating as one or more servers; and a cooling system coupled to the one or more electronic devices, the cooling system including an inlet port and an outlet port to be coupled to the electronic devices, a first loop having a heat exchanger coupled to the inlet port and the outlet port, wherein the heat exchanger is to receive fluid from the inlet port, to exchange heat generated by the electronic devices and carried by the fluid, and to return the fluid to the electronic devices via the outlet port, and a second loop coupled to the inlet port and the first loop, the second loop having a buffer unit and a first valve to control the fluid to flow into the buffer unit for storage and to discharge the fluid from the buffer unit to follow into the first loop for heat exchange, wherein the second loop is bidirectional, wherein the buffer unit comprises an air section to store air and a buffer section to store a portion of the fluid, and wherein the air section is to adjust an air pressure based on a temperature obtained from a temperature sensor disposed on the heat exchanger and a fluid pressure obtained from a pressure sensor disposed near the inlet port.

12. The electronic rack of claim 11, wherein the first valve is to allow the fluid to be stored in the buffer unit in response to determining that the temperature is above a predetermined temperature and the fluid pressure is above a predetermined pressure.

13. The electronic rack of claim 12, wherein the stored fluid is discharged from the buffer unit to the heat exchanger for heat exchange, in response to determining that the temperature is below the predetermined temperature or an air pressure of the air section of the buffer unit is above a predetermined air pressure.

14. The electronic rack of claim 13, wherein the buffer unit further comprises a pressure adjusting valve to pump air into the air section to provide pressure to force the fluid out of the buffer unit during discharge.

15. The electronic rack of claim 11, wherein the second loop further comprises a second valve to connect the buffer unit to the outlet port, and wherein the second valve is to allow the fluid from the buffer section of the buffer unit to the outlet port, bypassing the heat exchanger.

16. The electronic rack of claim 15, wherein the second valve is a pressure controllable valve to control a flowrate from the buffer unit to the outlet port based on an air pressure within the air section of the buffer unit.

17. The electronic rack of claim 15, wherein the cooling system further comprises a third valve coupled between the inlet port and the heat exchanger, wherein the third valve is to control a flowrate into the heat exchanger.

18. The electronic rack of claim 11, wherein the fluid flowing into the second loop is a two-phase fluid including both liquid and vapor.

19. The electronic rack of claim 18, wherein the two-phase fluid is stored in the buffer unit, wherein the second loop, during a buffering period, is used to receive the liquid and the vapor, wherein the second loop, during a discharging period, is used for releasing the vapor, and wherein a liquid loop, connected between the buffer unit and the outlet port, is used for releasing the liquid during the discharging period.

20. A data center system, comprising:

a plurality of electronic racks, each electronic rack including one or more servers; and a cooling system coupled to the electronic racks to provide liquid cooling to the servers, the cooling system including an inlet port and an outlet port to be coupled to the electronic devices, a first loop having a heat exchanger coupled to the inlet port and the outlet port, wherein the heat exchanger is to receive fluid from the inlet port, to exchange heat generated by the electronic devices and carried by the fluid, and to return the fluid to the electronic devices via the outlet port, and a second loop coupled to the inlet port and the first loop, the second loop having a buffer unit and a first valve to control the fluid to flow into the buffer unit for storage and to discharge the fluid from the buffer unit to follow into the first loop for heat exchange, wherein the second loop is bidirectional, wherein the buffer unit comprises an air section to store air and a buffer section to store a portion of the fluid, and wherein the air section is to adjust an air pressure based on a temperature obtained from a temperature sensor disposed on the heat exchanger and a fluid pressure obtained from a pressure sensor disposed near the inlet port.

* * * * *